United States Patent
Allman et al.

(10) Patent No.: US 6,524,926 B1
(45) Date of Patent: Feb. 25, 2003

(54) METAL-INSULATOR-METAL CAPACITOR FORMED BY DAMASCENE PROCESSES BETWEEN METAL INTERCONNECT LAYERS AND METHOD OF FORMING SAME

(75) Inventors: Derryl Allman, Camas, WA (US); John Gregory, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 172 days.

(21) Appl. No.: 09/723,434

(22) Filed: Nov. 27, 2000

(51) Int. Cl.[7] .................. H01L 21/20; H01L 21/8242; H01L 21/44
(52) U.S. Cl. .................. 438/387; 438/243; 438/622
(58) Field of Search .................. 436/381, 386, 436/387, 393, 244, 243, 253, 240, 238, 239, 241, 399, 618, 622; 257/296, 301, 303, 306

(56) References Cited

U.S. PATENT DOCUMENTS

| | | | |
|---|---|---|---|
| 5,198,390 A | * | 3/1993 | MacDonald et al. .......... 438/52 |
| 5,736,457 A | | 4/1998 | Zhao |
| 5,753,948 A | | 5/1998 | Nguyen et al. |
| 5,846,876 A | | 12/1998 | Bandyopadhyay et al. |
| 6,271,084 B1 | * | 8/2001 | Tu et al. ...................... 438/253 |
| 6,291,305 B1 | * | 9/2001 | Huang et al. ................ 438/381 |
| 6,441,419 B1 | * | 8/2002 | Johnson et al. .............. 257/296 |

* cited by examiner

Primary Examiner—Wael Fahmy
Assistant Examiner—Brook Kebede
(74) Attorney, Agent, or Firm—John R. Lev, LLC

(57) ABSTRACT

Within metal interconnect layers above a substrate of an integrated circuit, a vertical metal-insulator-metal (VMIM) capacitor is formed by the same damascene metallization types of processes that formed the metal interconnect layers. The metal interconnect layers have horizontal metal conductor lines, are vertically separated from other metal interconnect layers by an interlayer dielectric (ILD) layer, and electrically connect to the other metal interconnect layers through via connections extending through the ILD layer. One vertical capacitor plate of the VMIM capacitor is defined by a metal conductor line and a via connection. The other vertical capacitor plate is defined by a metal region adjacent to the metal conductor line and the via connection. The metal conductor line, the via connection and the metal region are formed by the damascene metallization processes.

17 Claims, 6 Drawing Sheets

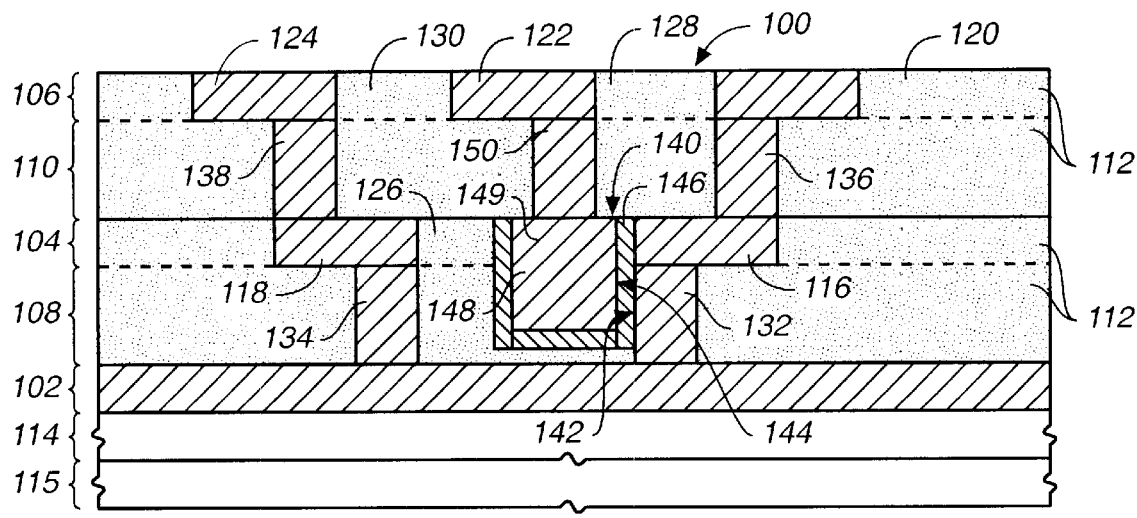
FIG._1
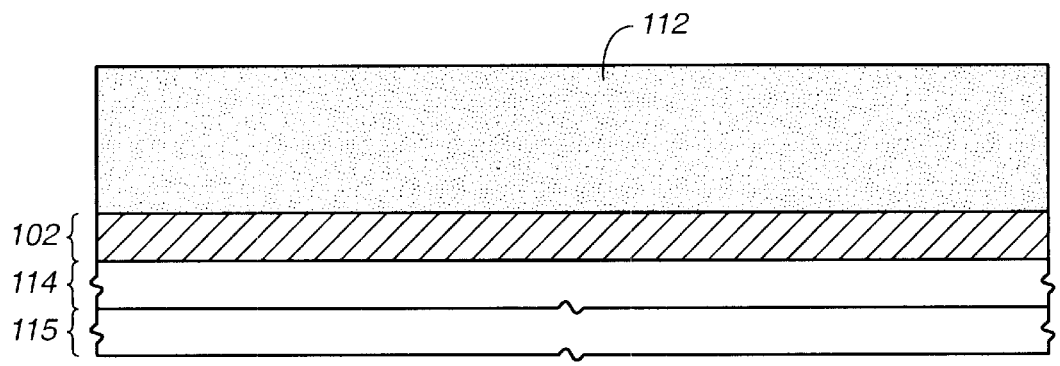
FIG._2
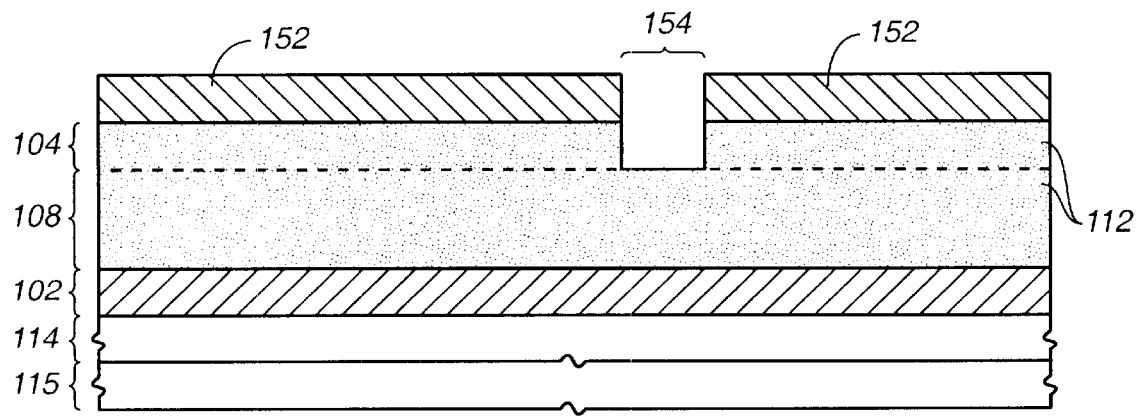
FIG._3

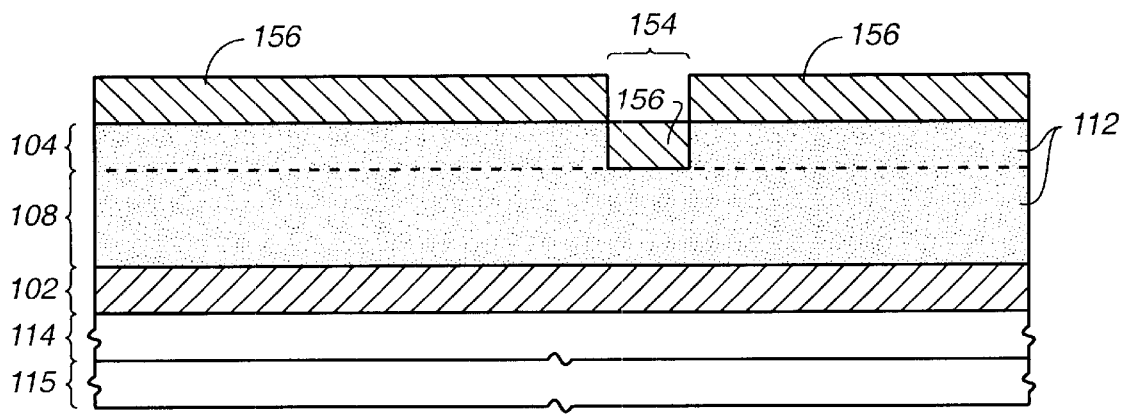
FIG._4
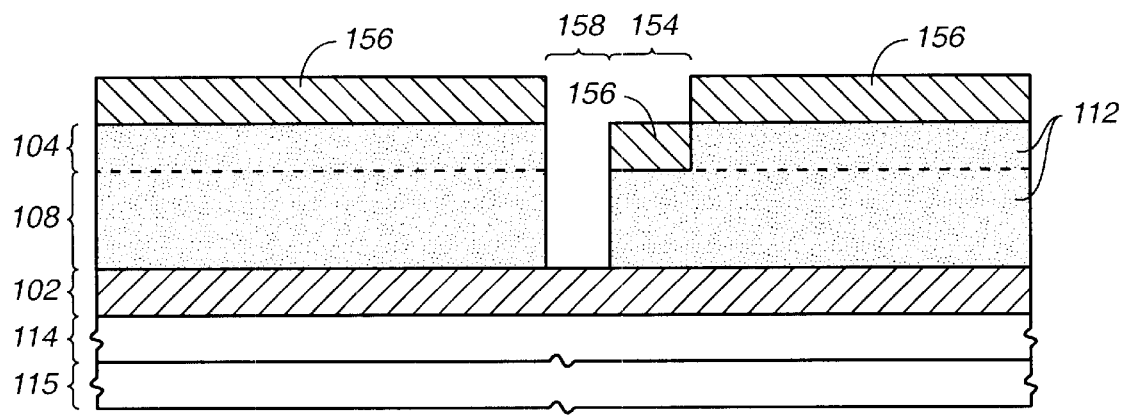
FIG._5
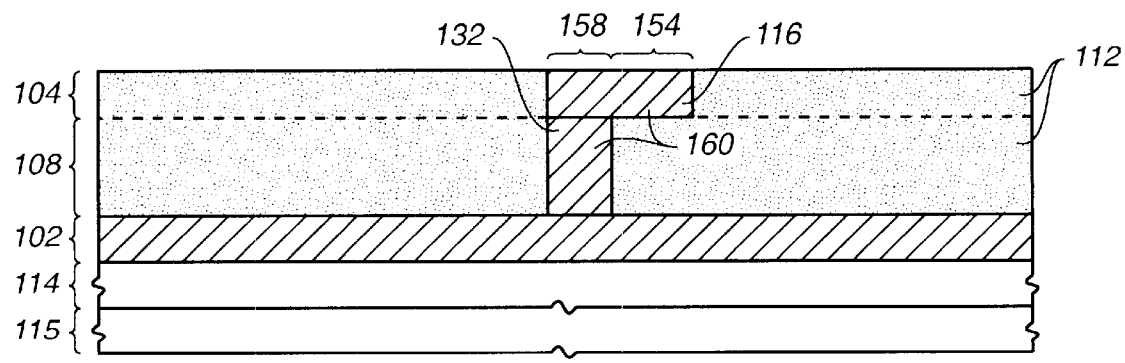
FIG._6

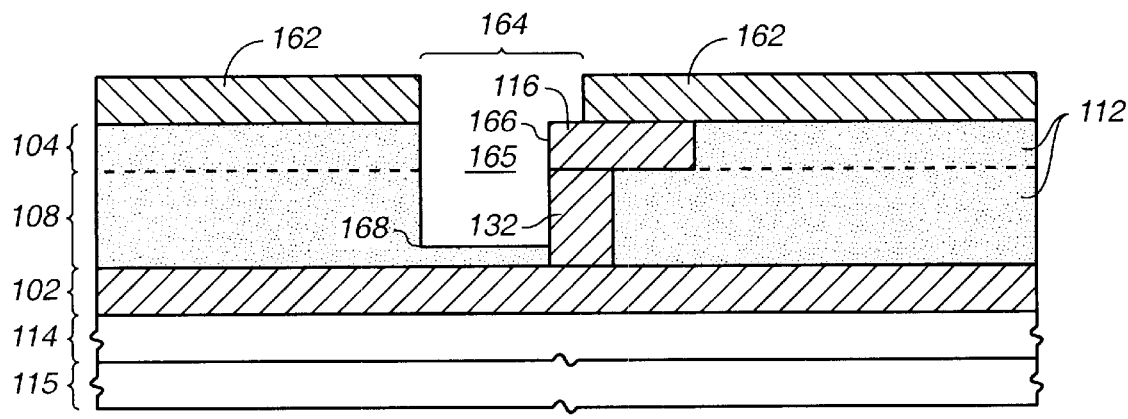
FIG._7
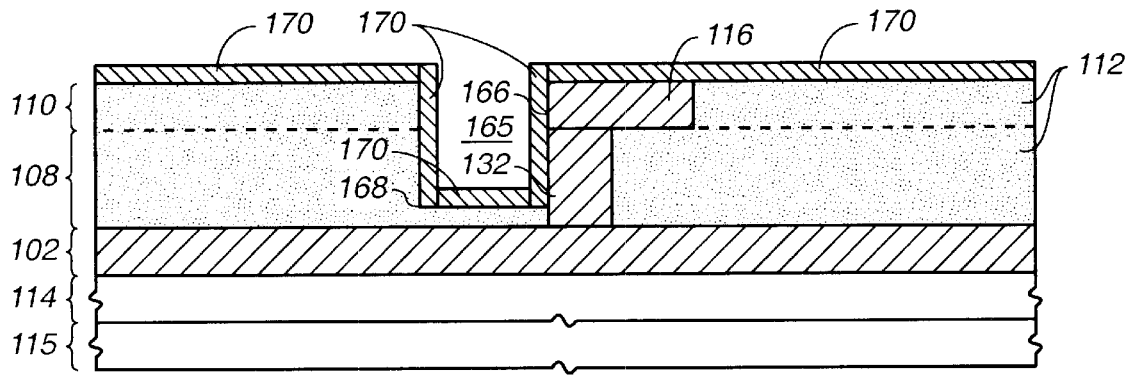
FIG._8
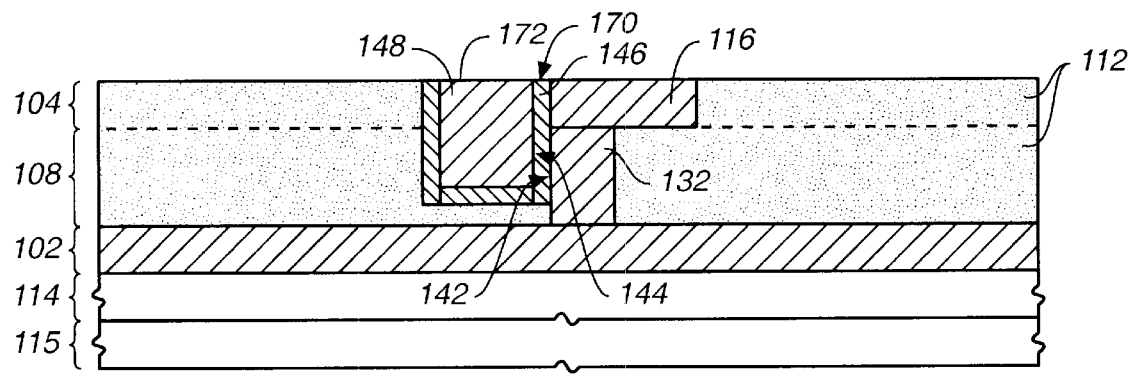
FIG._9

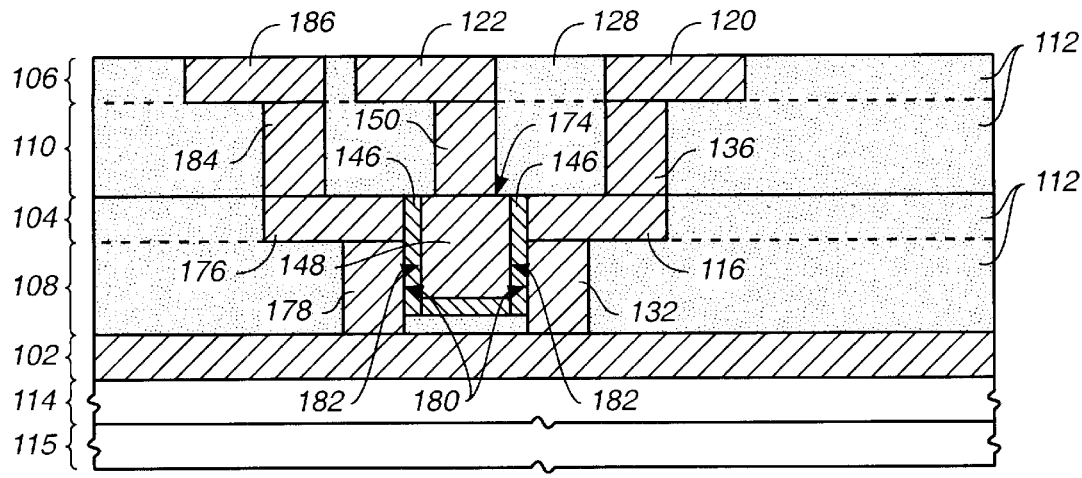
FIG._10
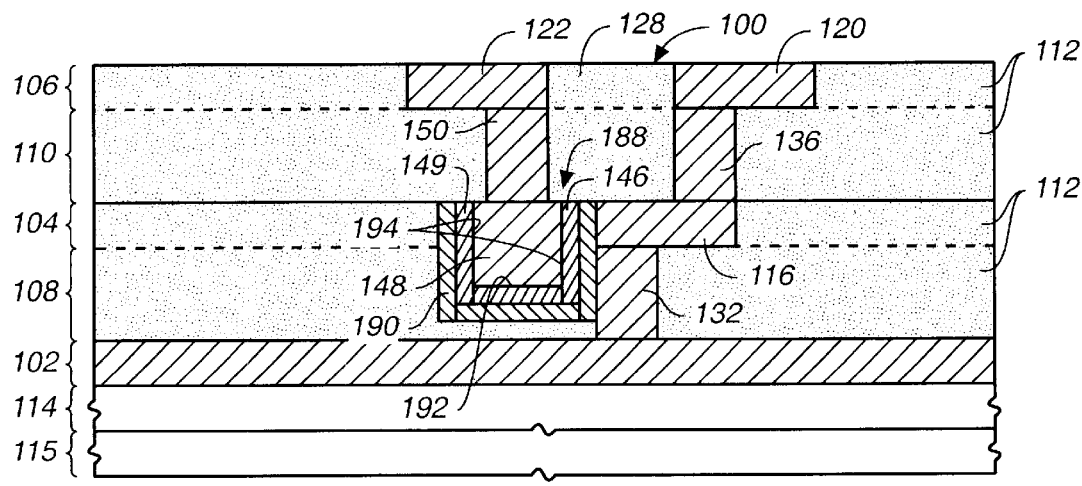
FIG._11
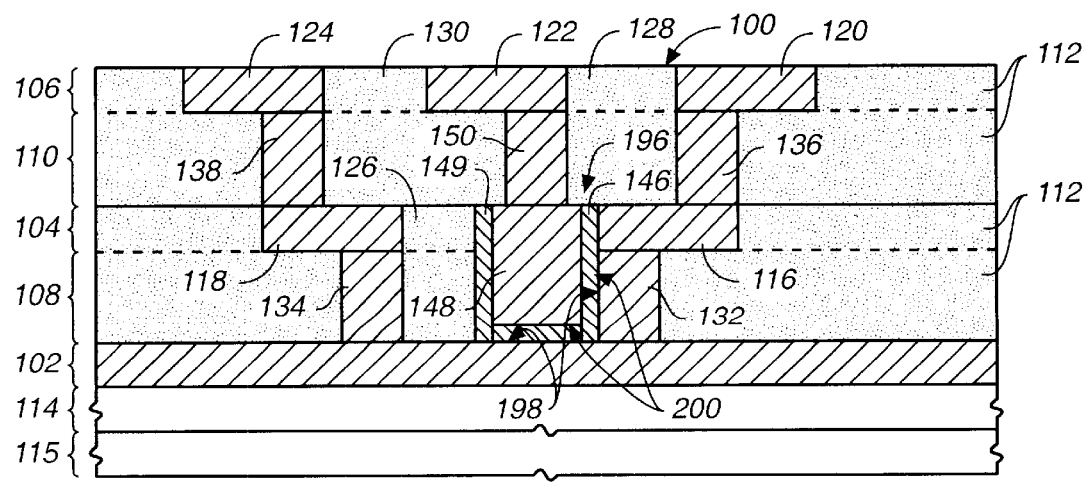
FIG._12

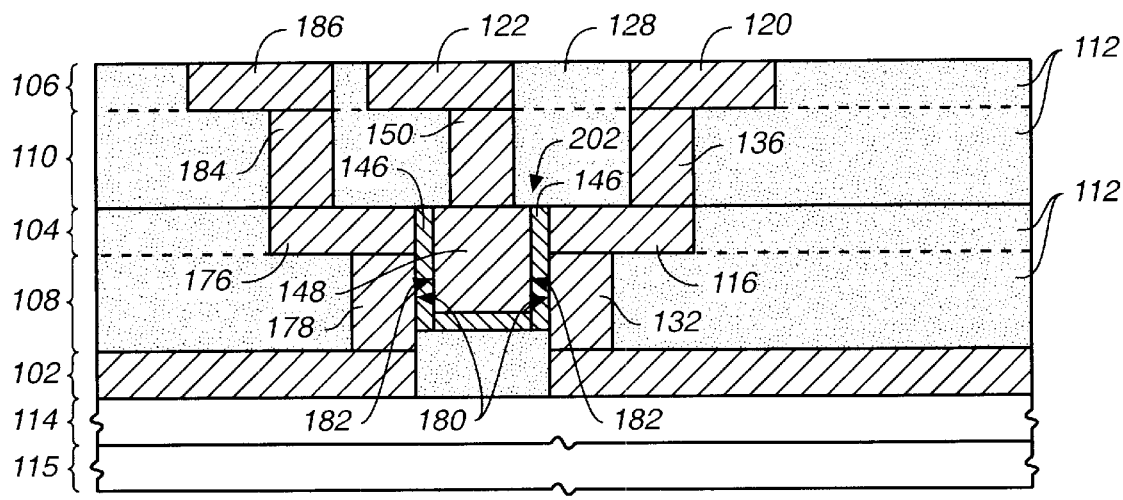
FIG._13
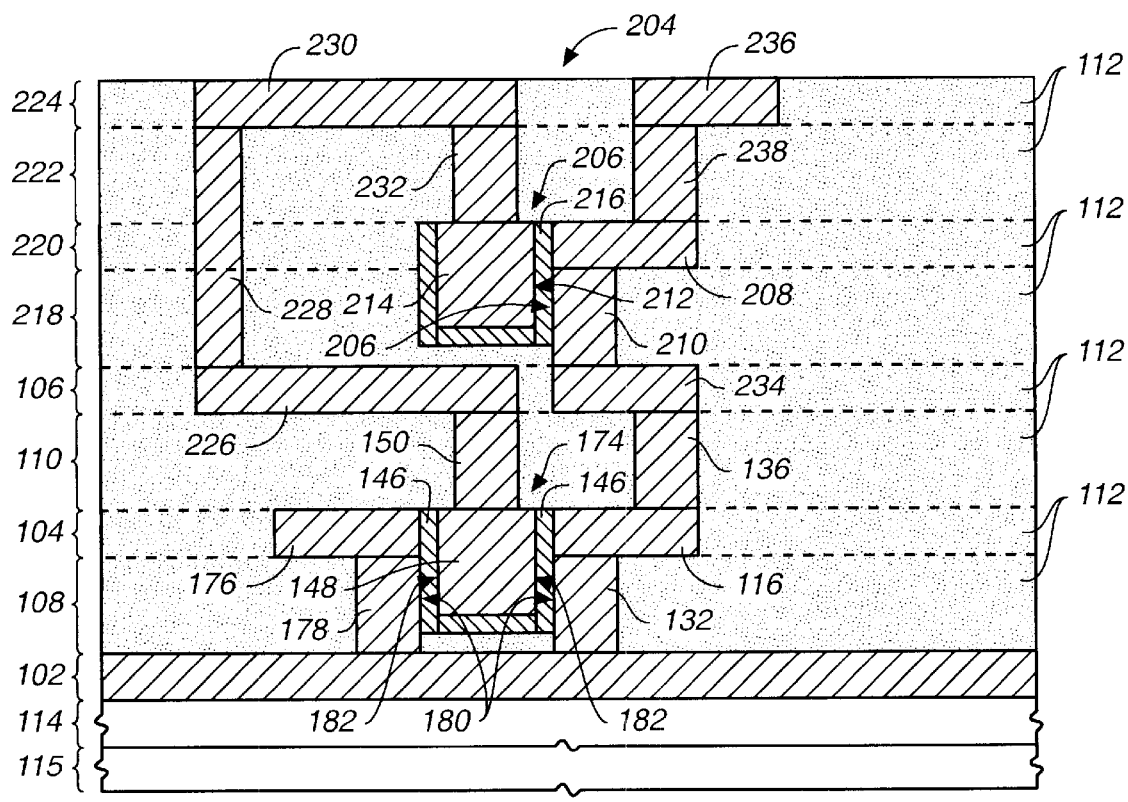
FIG._14

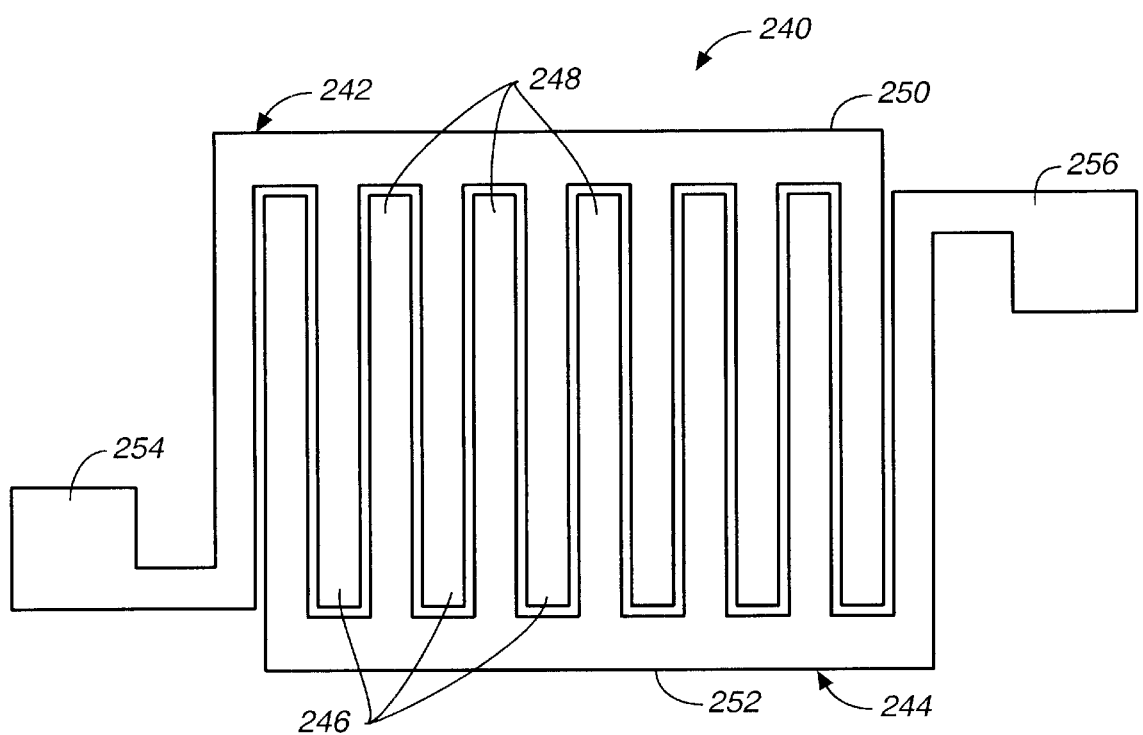
FIG._15

METAL-INSULATOR-METAL CAPACITOR FORMED BY DAMASCENE PROCESSES BETWEEN METAL INTERCONNECT LAYERS AND METHOD OF FORMING SAME

FIELD OF THE INVENTION

This invention relates to semiconductor processing of integrated circuit (IC) structures. More particularly, the present invention relates to processes using damascene (or in-laid) metallization to form a capacitor between metal interconnect layers of an IC.

BACKGROUND OF THE INVENTION

In a typical integrated circuit (IC), multiple metal interconnect layers overlay the substrate and the circuit elements constructed thereon. The metal interconnect layers are separated from each other and from the substrate by dielectric layers. Each metal interconnect layer is formed into individual patterns of metal traces, or interconnects, that electrically connect the various circuit elements of the IC. Also, other circuit elements, such as capacitors, can be formed between the metal interconnect layers to relieve space constraints at the substrate level and to improve performance of these elements.

A common technique for forming the metal interconnects involves depositing a film of the metal material onto the top surface of the IC (typically a dielectric layer) and etching away the undesired areas of this film to form the pattern. This technique can also be used to form the capacitors between the metal interconnect layers.

Another way to form the metal interconnects involves etching the pattern into the dielectric layer to form trenches in the dielectric layer and then depositing the metal over the dielectric layer and into the trenches. The metal is then removed with a chemical mechanical polishing (CMP) or etching process back to the dielectric layer, leaving the metal in the trenches in the patterns of the metal interconnects. This second method is known as a "damascene process." Via connections between the metal interconnect layers and the substrate structures may also be formed by damascene metallization processes. In fact, the via connections and the overlying metal interconnects can be formed in the same damascene process, called a "dual damascene" process.

Damascene metallization processes for forming the metal interconnect layers have gained in popularity over the metal deposition and etching types of processes described briefly above. The popularity is due in part to the fact that the CMP processes commonly used at the end of the damascene process create a fairly smooth surface upon which the next layers can be formed. The damascene processes can also avoid some of the complications of metal etching which have occurred as geometries of the structures (i.e. electrical elements and conductors) have been made smaller in width. For example, to construct metal elements or conductors of the same resistance or conductance as prior elements, but with a narrower width, the height must be made greater for a greater aspect ratio. To do so using metal etching processes requires that the metal be deposited in a relatively thick layer and then etched to form relatively tall and narrow structures with small gaps in between that are then filled with insulating material. It has proven very difficult, however, to use such techniques to form the tall, narrow, closely-spaced metal structures and then fill in the gaps. Damascene processes, on the other hand, have been proven to be able to form the necessary deep, narrow, closely-spaced trenches and to fill the trenches with the metal material to form the desired metal elements and conductors.

Due to the increasing popularity of damascene metallization, it has become desirable to form the capacitors between the metal interconnect layers using the damascene processes. The capacitor formation processes, however, are typically complex and require considerable extra steps to perform. Also, the capacitor structures formed thereby have complex patterns, which require stringent process controls.

It is with respect to these and other background considerations that the present invention has evolved.

SUMMARY OF THE INVENTION

The present invention forms a vertical metal-insulator-metal (VMIM) capacitor between metal interconnect layers of an integrated circuit (IC). The technique for forming the capacitor utilizes damascene processes to form a simple vertical capacitor structure with a minimum of additional process steps beyond those needed to form the metal interconnects. The plates of the capacitor are formed using the same damascene processes used to form the metal interconnects in the interconnect layers and the via connections therebetween. In this manner, the VMIM capacitor is formed with a deposited dielectric as the insulator between the capacitor plates.

These and other improvements are achieved in a method of forming a VMIM capacitor in an interlayer dielectric (ILD) layer between upper and lower metal interconnect layers in an integrated circuit (IC), the lower metal interconnect layer being separated from a substrate of the IC by at least one dielectric layer or another underlying metal interconnect layer. The upper metal interconnect layer is formed by a damascene metallization process in a top side of the ILD layer along with a first vertical capacitor plate. The first vertical capacitor plate of the VMIM capacitor is formed in the upper metal interconnect layer and the ILD layer by the same damascene metallization process that forms the upper metal interconnect layer. A capacitor dielectric material is formed or deposited onto a vertical sidewall of the vertical capacitor plate. A second vertical capacitor plate is formed by another damascene metallization process adjacent to the capacitor dielectric material. In this manner, the VMIM capacitor is formed with two vertical capacitor plates and the capacitor dielectric therebetween using the same or similar damascene metallization process steps used to form the metal interconnect layers.

The method preferably also includes exposing a vertical sidewall of the first vertical capacitor plate by forming a trench in the ILD layer adjacent to the first vertical capacitor plate. A metal liner is then preferably formed on the inner bottom and sidewall surfaces of the trench, including on the exposed vertical sidewall of the first capacitor plate. The metal liner thus forms an extension of the first vertical capacitor plate as an outer capacitor plate of the VMIM capacitor at least partially surrounding the second, or inner, vertical capacitor plate with the capacitor dielectric material therebetween. Alternatively, the method includes forming the first vertical capacitor plate and a third vertical capacitor plate on opposite sides of the second vertical capacitor plate and electrically connecting the first and third vertical capacitor plates together to form an outer capacitor plate of the VMIM capacitor. Additionally, the method preferably forms one or more metal conductor lines in the upper metal interconnect layer and one or more via connections through the ILD layer, such that the metal conductor line(s) and the via connection(s) form the first (and third, if present) vertical capacitor plate(s) of the VMIM capacitor.

The method also preferably forms a bottom capacitor plate for the VMIM capacitor below the second vertical capacitor plate with the capacitor dielectric material therebetween. In this embodiment, it is further preferable to form a bottom capacitor plate within the lower metal interconnect layer. Alternatively, the method preferably removes the portion of the lower metal interconnect layer that is below the region occupied by the second vertical capacitor plate, when it is desired to ensure that there is no bottom capacitance.

The method also preferably forms another capacitor structure, similar to the one described above, but disposed in another ILD layer and metal interconnect layer above the previously mentioned ILD layer and upper metal interconnect layer. Corresponding capacitor plates in the two capacitor structures are electrically connected together to form two larger stacked capacitor plates for the VMIM capacitor. An additional ILD layer and metal interconnect layer are preferably interposed between the two capacitor structures to provide electrical connections through the additional metal interconnect layer between the corresponding capacitor plates of the upper and lower capacitor structures.

Alternatively, another capacitor structure is formed, similar to the one described above and disposed in the same ILD layer and metal interconnect layer, but located beside the first capacitor structure. Corresponding capacitor plates of the two capacitor structures are preferably electrically connected together to form two larger capacitor plates for the VMIM capacitor.

The previously mentioned and other improvements are also achieved in a VMIM capacitor in an IC. The IC has a substrate, a lower metal interconnect layer and an upper damascene-metallization interconnect layer. The lower metal interconnect layer and the substrate are separated by a dielectric layer, and the lower metal interconnect layer and the damascene-metallization interconnect layer are separated by an ILD layer. The VMIM capacitor comprises two vertical capacitor plates and a capacitor dielectric between the two vertical capacitor plates. The two vertical capacitor plates are formed by damascene metallization processes. One of the vertical capacitor plates is formed at least partially by the same damascene metallization process used to form the upper damascene-metallization interconnect layer. Both vertical capacitor plates are disposed within the upper damascene-metallization interconnect layer and at least partially through the ILD layer.

It is preferable that the VMIM capacitor also comprise a metal conductor line within the upper damascene-metallization interconnect layer and a via connection extending between the two interconnect layers. In this manner, the conductor line and the via connection define at least a portion of the first vertical capacitor plate.

It is also preferable that the VMIM capacitor further comprise the inner and outer vertical capacitor plates. The outer capacitor plate preferably includes the first vertical capacitor plate and also preferably an additional (third) vertical capacitor plate disposed on an opposite side of the second (inner) vertical capacitor plate from the first vertical capacitor plate. The first and third vertical capacitor plates are electrically connected together. Thus, the outer vertical capacitor plate at least partially surrounds the inner vertical capacitor plate.

The VMIM capacitor preferably further comprises a metal liner that at least partially surrounds the capacitor dielectric and second vertical capacitor plate. The metal liner also preferably electrically connects to the first vertical capacitor plate to form an extension of the first vertical capacitor plate as an outer capacitor plate.

The VMIM capacitor preferably further comprises a bottom capacitor plate below the second vertical capacitor plate and electrically connected to the first vertical capacitor plate. The bottom capacitor plate also preferably is integrated in metal conductor lines in the lower metal interconnect layer. Alternatively, in order to avoid undesired bottom capacitance, any metal conductor lines in the lower metal interconnect layer are preferably excluded from the region below the second vertical capacitor plate.

The VMIM capacitor also preferably comprises a stacked capacitor configuration, wherein a second capacitor structure, similar to the capacitor structure described above, is formed in an additional ILD layer and additional upper damascene-metallization interconnect layer above the aforementioned ILD layer and upper damascene-metallization interconnect layer. Corresponding capacitor plates in the two capacitor structures are electrically connected together to form a larger stacked capacitor. Alternatively, the VMIM capacitor preferably comprises a side-by-side capacitor configuration, wherein a second capacitor structure, similar to the capacitor structure described above, is formed in the same ILD layer and upper damascene-metallization interconnect layer in which the first capacitor structure is formed, but laterally spaced from the first capacitor structure. Corresponding capacitor plates in the two capacitor structures are electrically connected together to form a larger side-by-side capacitor.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

BRIEF DESCRIPTION OF THE DRAWINGS

FIG. 1 is a cross sectional view of a vertical metal-insulator-metal capacitor between metal interconnect layers of an integrated circuit.

FIGS. 2–9 are cross sectional views of stages of formation illustrating the process steps to form the capacitor shown in FIG. 1.

FIGS. 10–14 are cross sectional views of alternative embodiments of the capacitor shown in FIG. 1.

FIG. 15 is a plan view of an interdigitated capacitor with a comb-like structure incorporating any of the capacitors shown in FIGS. 1 and 10–14 in a side-by-side configuration.

DETAILED DESCRIPTION

An integrated circuit (IC) structure 100 incorporating the present invention typically has two metal interconnect layers 102 and 104 and preferably a third metal interconnect layer 106, as shown in FIG. 1. Metal interconnect layers 102 and 104 are separated by interlayer dielectric (ILD) layer 108. Metal interconnect layers 104 and 106 are separated by another ILD layer 110. The ILD layers 108 and 110 are typically formed from an appropriate dielectric or oxide material 112. Metal interconnect layer 102 is above another dielectric layer 114, which is above another metal interconnect layer or substrate 115.

Metal conductor lines 116 and 118 extend throughout the metal interconnect layer 104. Other metal conductor lines 120, 122 and 124 extend throughout the metal interconnect layer 106. Region 126 of the dielectric material 112 separates the metal conductor lines 116 and 118. Similarly, region 128 of the dielectric material 112 separates the metal conductor lines 120 and 122, and region 130 of the dielectric material 112 separates the metal conductor lines 122 and 124.

Conductive vias 132 and 134 connect the metal conductor lines 116 and 118, respectively, to the metal interconnect layer 102. Similarly, conductive vias 136 and 138 connect the metal conductor lines 116 and 118, respectively, to the metal conductor lines 120 and 124, respectively. The metal conductor lines 118 and 124 and the conductive vias 134 and 138 illustrate typical interconnect structures connecting the metal interconnect layers 102, 104 and 106. The metal conductor line 116 and the conductive via 132, however, are integrated with a vertical capacitor 140.

The vertical capacitor 140 generally comprises a right (as shown) capacitor plate 142, a left (as shown) capacitor plate 144 and a dielectric layer 146 therebetween. The right capacitor plate 142 generally is formed by a portion of the metal conductor line 116 and a portion of the conductive via 132, both of which are preferably of the same metal material, adjacent to the dielectric layer 146. Alternatively, the right capacitor plate 142 is formed by only a portion of the metal conductor line 116 and no portion of the conductive via 132. The left capacitor plate 144 generally is formed by a metal region 148 disposed in the metal interconnect layer 104 and partially in the ILD layer 108 and surrounded by the dielectric layer 146, except on its top side 149. Since both capacitor plates 142 and 144 comprise a metal material (preferably the same metal material), and since the capacitor plates 142 and 144 are vertically oriented, the capacitor 140 is of the type known as a vertical metal-insulator-metal (VMIM) capacitor.

The right capacitor plate 142 connects to other components of the IC structure 100 through any of the metal interconnect layers 102,104 and/or 106. The lower portion of the conductive via 132 connects the right capacitor plate 142 to the metal interconnect layer 102. Alternatively, the metal conductor line 116 connects the right capacitor plate 142 to other components through the metal interconnect layer 104 or through the conductive via 136 to the metal conductor line 120 of the metal interconnect layer 106.

The left capacitor plate 144 connects to other components of the IC structure 100 through the metal interconnect layer 104, since part of the left capacitor plate 144 is disposed within the metal interconnect layer 104. Alternatively, another conductive via 150 connects the top 149 of the metal region 148, which forms the left capacitor plate 144, to the metal conductor line 122 in the metal interconnect layer 106. The process to form the capacitor 140 is shown in FIGS. 2 to 9 and includes damascene processes to form the metal components.

The process for forming the capacitor 140 generally begins with the formation of the metal interconnect layer 102 (by conventional metal deposition processes) above the dielectric layer 114 with the dielectric material 112 deposited (by conventional deposition processes) on top of the metal interconnect layer 102, as shown in FIG. 2. The metal interconnect layer 102 is typically formed into metal interconnect patterns (not shown) and connected to the substrate 115 by via connections (also not shown).

As shown in FIG. 3, a layer of conventional photoresist material 152 is applied to the top of the dielectric material 112. The photoresist material 152 is patterned and removed (by conventional photolithography and etch processes) from region 154 to expose the dielectric material 112 in the interconnect line patterns for the metal interconnect layer 104. The exposed dielectric material 112 is removed (by conventional timed etch processes or a conventional stop layer etch) below region 154 down to the point between the metal interconnect layer 104 and the ILD layer 108.

The photoresist material 152 is removed (by conventional etch and clean processes), and another photoresist material 156 is applied (by conventional deposition processes) on the top of the dielectric material 112, including the inside of the region 154, as shown in FIG. 4. The photoresist material 156 is patterned with the via connection patterns by conventional photolithographic processes.

As shown in FIG. 5, the photoresist material 156 is removed, by conventional etch processes, from region 158. Removal of the photoresist material 156 exposes the top of the dielectric material 112 in the region 158. The dielectric material 112 is then removed, by conventional etch processes, from the region 158 down to the metal interconnect layer 102. The metal interconnect layer 102 thus exposed may serve as an etch stop for the dielectric etch process.

At this point, the trenches have been formed for the placement of the metal conductor line 116 (FIG. 1) and the conductive via 132 (FIG. 1), which will form the right capacitor plate 142 (FIG. 1). As an alternative, however, the left capacitor plate 144 could be formed first followed by the formation of the metal conductor line 116 and the conductive via 132, but this method is not preferred.

The photoresist material 156 is removed by conventional etching and cleaning processes, as shown in FIG. 6. A metal material 160 is deposited, by conventional deposition processes, onto the top of the dielectric material 112 and into the regions 154 and 158 onto the top of the exposed metal interconnect layer 102. The metal material 160 is preferably aluminum, copper or an alloy thereof. A conventional liner material (not shown) may also be deposited onto the exposed metal interconnect layer 102 and the dielectric material 112 before the metal material 160 is deposited to prevent intermaterial diffusion in subsequent processes. The metal material 160 deposited on the dielectric material 112 outside of either region 154 or 158 and above the metal interconnect layer 104 is removed in a CMP process to form a substantially smooth surface within the regions 154 and 158 and approximately level with the top surface of the dielectric material 112. The metal material 160 deposited in the region 158 within the ILD layer 108 generally forms the via connection 132 and has an electrical connection to the metal interconnect layer 102. The metal material 160 deposited in the regions 154 and 158 within the metal interconnect layer 104 generally forms the metal conductor line 116. In this manner the right capacitor plate 142 (FIG. 1) is completed. Additionally, the via connection 134 and the metal conductor line 118 (FIG. 1) are preferably formed at the same time and using the same process steps described above as are the via connection 132 and the metal conductor line 116.

The above described process of forming the via connection 132 and the metal conductor line 116 in the same metal deposition step is known as a "dual damascene" process. It is understood, however, that the via connection 132 and the metal conductor line 116 can be formed separately in different damascene process steps.

At this point, if it is not desired to form capacitors between the metal interconnect layers 102 and 104 according to the present invention, the processing continues by generally repeating the above steps to form the next ILD layer 110 (FIG. 1), the via connections 136 and 138 and the metal conductor lines 120 and 124. To form the capacitor 140 (FIG. 1), however, the following steps are performed.

As shown in FIG. 7, another photoresist material 162 is deposited (by conventional deposition processes) onto the top surface of the dielectric material 112 and the top surface of the metal conductor line 116, so that conventional photolithography and oxide trench etch processes can be used to define and transfer the image of the remaining portion of the capacitor into the ILD layer 108. The photoresist material 162 is patterned and removed (by conventional photolithographic and oxide trench etching processes) in the region 164 to expose the dielectric material 112 thereunder and a small portion of the metal conductor line 116. The dielectric material 112 is etched, by conventional processes, in the region 164 to form a trench 165. The region 164 overlaps a portion of the metal conductor line 116 to ensure that the common vertical metal surface, or sidewall, 166 of the metal conductor 116 and the via connection 132 that defines the right capacitor plate 142 will be etched clean of the dielectric material 112. The dielectric etch process stops at a predetermined depth 168 into the ILD layer 108, which is preferably determined either by a timed etch process or by previously forming an etch stop layer (not shown) at the predetermined depth in the dielectric material 112. The etch stop layer, if used, is preferably silicon nitride or other material with a high selectivity to oxide.

Where it is desired that there be little or no stray capacitance per unit length between the bottom of the metal region 148 (FIG. 1) and the metal interconnect layer 102 (FIG. 1), it is preferred that the depth of the metal region 148, and therefore of the trench 165, be much greater than (e.g. by an order of magnitude) the following formula:

$$D = \frac{w}{\left(1 + \frac{\epsilon_{rA}}{\epsilon_{rC}} \cdot \frac{t_C}{t_A}\right)}.$$

Where D is the depth of the metal region 148 (or of the trench 165), w is the width of the metal region 148 (or of the trench 165), $\epsilon_{rA}$ is the relative dielectric permitivity of the dielectric layer 146 (FIG. 1) between the two capacitor plates 142 and 144 (FIG. 1), $\epsilon_{rC}$ is the relative permitivity of the dielectric material 112 (FIG. 1) below the predetermined depth 168, $t_C$ is the thickness of the dielectric material 112 below the predetermined depth 168, and $t_A$ is the thickness of the dielectric layer 146 between the two capacitor plates 142 and 144. In this manner, the capacitance between the metal region 148 and the metal interconnect layer 102 is much less than the capacitance between the metal region 148 and the metal conductor 116 and the via connection 132 (FIG. 1).

As shown in FIG. 8, the photoresist material 162 (FIG. 7) is removed by conventional techniques, such as plasma ash and clean processes. Additionally, one or more cleaning steps are preferably performed to ensure the cleanliness of the metal surface 166. A capacitor dielectric 170 is deposited (by conventional deposition processes) onto the top of the dielectric material 112, the top of the metal conductor line 116 and all surfaces of the trench 165, particularly on the metal surface 166. Alternatively, the capacitor dielectric 170 can be grown in an oxidizing environment, in which only the metal surface 166 will form the oxide for the capacitor dielectric 170, which is the only location where the capacitor dielectric 170 is required. The remaining open area of the trench 165 defines the metal region 148 shown in FIG. 1.

As shown in FIG. 9, a metal material 172 is deposited into the metal region 148, by conventional metal deposition processes. The metal material 172 preferably is the same type of metal as that used for the metal conductor line 116 and the via connection 132. The portion of the capacitor dielectric 170 that covered the top surface of the metal conductor line 116 and the top surface of the dielectric material 112 is removed (by conventional CMP processes) either before the deposition of the metal material 172 or after the metal material 172 is removed from the same regions. The portion of the metal material 172 that covers either the top surface of the capacitor dielectric 170 (if the capacitor dielectric 170 is not previously removed) or the top surfaces of the metal conductor line 116 and the dielectric material 112 (if the capacitor dielectric 170 is previously removed from these surfaces) is removed in a CMP process. The CMP process forms a substantially smooth surface at the top of the metal material 172 approximately level with the top surface of the metal conductor line 116 and the dielectric material 112. In this manner, the left capacitor plate 144 (also FIG. 1) is formed in a damascene process.

The metal material 172 in the metal region 148 defines the left capacitor plate 144, and the adjacent portions of the metal conductor line 116 and the via connection 132 define the right capacitor plate 142 (also shown in FIG. 1). Likewise, the portion of the capacitor dielectric 170 between the capacitor plates 142 and 144 defines the dielectric layer 146 (also shown in FIG. 1).

At this point, the capacitor 140 has been formed. The remaining process steps needed to form the ILD layer 110 (FIG. 1), the via connections 136, 138 and 150 (FIG. 1) and the metal conductor lines 120, 122 and 124 (FIG. 1) essentially repeat the processes used to form the ILD layer 108, the metal conductor line 116 and the via connection 132, described with reference to FIGS. 2 to 6, above.

A capacitor 174, shown in FIG. 10, is formed with similar process steps as those described above to form the capacitor 140 (FIG. 1) and has a similar structure thereto, but with differences that provide a larger capacitance, due to a larger effective area between capacitor plates. The capacitor 174, similar to capacitor 140, is formed above metal interconnect layer 102. The metal interconnect layer 102 overlays the dielectric layer 114, which overlays the substrate 115.

In the capacitor 174, the metal conductor line 116 and the via connection 132 form part of one capacitor plate. Another metal conductor line 176 within the metal interconnect layer 104 and another via connection 178 form the other part of the capacitor plate with the metal conductor line 116 and the via connection 132. The metal conductor lines 116 and 176 and the via connections 132 and 178 are positioned on opposite sides of the metal region 148. Thus, they form an outer capacitor plate 180 for the capacitor 174, and the sides of the metal region 148 form an inner capacitor plate 182 for the capacitor 174. The dielectric layer 146 surrounds the sides of the metal region 148 to separate the inner capacitor plate 182 from the outer capacitor plate 180 and form the capacitor dielectric for the capacitor 174.

The via connection 136 electrically connects the metal conductor line 116 to the metal conductor line 120 in the metal interconnect layer 106. Likewise, another via connection 184 electrically connects the metal conductor line 176 to another metal conductor line 186 in the metal interconnect layer 106. The outer capacitor plate 180 is connected either through the via connections 132 and 178 to the metal interconnect layer 102 or through the metal conductor lines 116 and 176 either to the metal interconnect layer 104 or to the via connections 136 and 184 to the metal conductor lines 120 and 186 in the metal interconnect layer 106. The inner capacitor plate 182 electrically connects either directly to the metal interconnect layer 104 or through the via connection 150 to the metal conductor line 122 of the metal interconnect layer 106.

The via connection 178 and the metal conductor line 176 are formed simultaneously with the via connection 132 and the metal conductor line 116 using the same dual damascene process steps described above. The dielectric layer 146 is formed using the deposition process described above, but making sure that the exposed sides of both via connections 132 and 178 and both metal conductor lines 116 and 176 are covered. The metal region 148 is formed in a damascene process as described above to fill the space formed by the dielectric layer 146. The ILD layer 110 is formed using the same process described above. Additionally, the via connection 184 and the metal conductor line 186 are formed simultaneously with the via connections 136 and 150 and the metal conductor lines 120 and 122 using the same dual damascene process steps described above.

A capacitor 188, shown in FIG. 11, is formed with similar process steps as those described above to form the capacitor 140 (FIG. 1) and has a similar structure thereto, but with differences that provide a larger capacitance, due to a larger effective area between capacitor plates. The capacitor 188, similar to capacitor 140, is formed above metal interconnect layer 102. The metal interconnect layer 102 overlays the dielectric layer 114, which overlays the substrate 115.

In the capacitor 188, a metal liner 190 is formed on the all surfaces of the trench 165 (FIG. 7), including on the metal surface 166 (FIG. 7) of the metal conductor line 116 and the via connection 132, prior to the placement of the capacitor dielectric 170 (FIG. 8). Connected to the metal conductor line 116 and the via connection 132, the metal liner 190 forms an outer capacitor plate for the capacitor 188. The capacitor dielectric 170 is formed on all of the surfaces of the metal liner 190 to form the dielectric layer 146, and the metal region 148 is formed in the space remaining. Surrounded by the metal liner 190, the bottom 192 and sidewalls 194 of the metal region 148 form an inner capacitor plate for the capacitor 188. The dielectric layer 146 surrounds the sides of the metal region 148 to separate the inner capacitor plate from the outer capacitor plate and form the capacitor dielectric for the capacitor 188. Having a much greater surface area for its capacitor plates than does the capacitor 140 (FIG. 1), the alternative capacitor 188 also has a much greater overall capacitance than does the capacitor 140. Additionally, the metal liner 190 can be used in each of the other embodiments shown in FIGS. 1, 10 and 12–14.

The via connection 136 electrically connects the metal conductor line 116 to the metal conductor line 120 in the metal interconnect layer 106. The outer capacitor plate of the alternative capacitor 188 is connected either through the via connection 132 to the metal interconnect layer 102 or through the metal conductor line 116 either to the metal interconnect layer 104 or to the via connection 136 to the metal conductor line 120 in the metal interconnect layer 106. The inner capacitor plate of the alternative capacitor 188 electrically connects either directly to the metal interconnect layer 104 or through the via connection 150 to the metal conductor line 122 of the metal interconnect layer 106.

The via connection 132 and the metal conductor line 116 are formed using the same dual damascene process steps described above. The dielectric layer 14 is formed using the deposition process described above, but making sure that the exposed surfaces of the metal liner 190 are covered. The metal region 148 is formed in a damascene process as described above to fill the space formed by the dielectric layer 146. The ILD layer 110 is formed using the same process described above. Additionally, the via connections 136 and 150 and the metal conductor lines 120 and 122 are formed using the same dual damascene process steps described above.

A capacitor 196, shown in FIG. 12, is formed with similar process steps as those described above to form the capacitor 140 (FIG. 1) and has a similar structure thereto, but with differences that provide a larger capacitance, due to a larger effective area between the capacitor plates. The capacitor 196, similar to capacitor 140, is formed above metal interconnect layer 102, but also includes a portion of the metal interconnect layer 102. As above, the metal interconnect layer 102 overlays the dielectric layer 114, which overlays the substrate 115.

The via connection 132 connects the metal conductor line 116 with the metal interconnect layer 102. Additionally, the trench 165 (FIG. 7) is formed down to the top surface of the metal interconnect layer 102, so the dielectric layer 146 is formed directly onto the metal interconnect layer 102. Therefore, in the capacitor 196, the metal conductor line 116 and the via connection 132 form a portion of one capacitor plate 198, and the portion of the metal interconnect layer 102 directly beneath the metal region 148 forms the remaining portion of the same capacitor plate 198.

Having portions on two sides (side and bottom) of the metal region 148, the capacitor plate 198 forms at least a partial outer capacitor plate for the capacitor 196, and the bottom and side of the metal region 148 form an inner capacitor plate 200 for the capacitor 196. The dielectric layer 146 surrounds the sides of the metal region 148 to separate the inner capacitor plate 200 from the outer capacitor plate 198 and form the capacitor dielectric for the capacitor 196. Additionally, the configuration for the alternative capacitor 196 can be used with the other embodiments shown in FIGS. 1, 10, 11 and 14.

As above, the via connection 136 electrically connects the metal conductor line 116 to the metal conductor line 120 in the metal interconnect layer 106. The outer capacitor plate 198 is connected either through the via connections 132 to the metal interconnect layer 102 or through the metal conductor line 116 either to the metal interconnect layer 104 or to the via connection 136 to the metal conductor line 120 in the metal interconnect layer 106. The inner capacitor plate 200 electrically connects either directly to the metal interconnect layer 104 or through the via connection 150 to the metal conductor line 122 of the metal interconnect layer 106.

The via connection 132 and the metal conductor line 116 are formed using the same dual damascene process steps described above. The dielectric layer 146 is formed using the deposition process described above, but making sure that the exposed sides of the via connection 132, the metal conductor line 116 and the metal interconnect layer 102 are covered. The metal region 148 is formed in a damascene process as described above to fill the space formed by the dielectric layer 146. The ILD layer 110 is formed using the same process described above. Additionally, the via connections 136 and 150 and the metal conductor lines 120 and 122 are formed using the same dual damascene process steps described above.

A capacitor 202, shown in FIG. 13, is formed with similar process steps as those described above to form the capacitor 174 (FIG. 10) and has a similar structure thereto, but with differences that reduce coupling capacitance below the metal region 148 when such coupling capacitance is undesired. The capacitor 202, similar to capacitor 174, is formed above metal interconnect layer 102 with two metal conductor lines 116 and 176 and two via connections 132 and 178, but the portion of the metal interconnect layer 102 directly beneath the metal region 148 has been removed, or etched away, and the space has been filled in with the dielectric material 112 during earlier formation of the various metal conductor lines in the metal interconnect layer 102 and the formation of the ILD layer 108. In this manner, unlike the embodiment shown in FIG. 12, coupling capacitance between the metal region 148 and the metal interconnect layer 102 is reduced or eliminated. The conditions under which the capacitor 196 is to be used determine whether the metal interconnect layer 102 will form part of the capacitor 196, or be removed, or remain without being used.

In the capacitor 202, the metal conductor line 116 and the via connection 132 form part of the outer capacitor plate 180. The other metal conductor line 176 and the other via connection 178 form the other part of the outer capacitor plate 180. The two portions of the outer capacitor plate 180 are electrically connected together through one of the metal interconnect layers 102,104 or 106. The sides of the metal region 148 form the inner capacitor plate 182 for the capacitor 202. The dielectric layer 146 surrounds the sides of the metal region 148 to separate the inner capacitor plate 182 from the outer capacitor plate 180 and form the capacitor dielectric for the capacitor 202.

The via connection 136 electrically connects the metal conductor line 116 to the metal conductor line 120 in the metal interconnect layer 106. Likewise, the via connection 184 electrically connects the metal conductor line 176 to the metal conductor line 186 in the metal interconnect layer 106. The outer capacitor plate 180 is connected either through the via connections 132 and 178 to the metal interconnect layer 102 or through the metal conductor lines 116 and 176 either to the metal interconnect layer 104 or to the via connections 136 and 184 to the metal conductor lines 120 and 186 in the metal interconnect layer 106. The inner capacitor plate 182 electrically connects either directly to the metal interconnect layer 104 or through the via connection 150 to the metal conductor line 122 of the metal interconnect layer 106.

The via connection 178 and the metal conductor line 176 are formed simultaneously with the via connection 132 and the metal conductor line 116 using the same dual damascene process steps described above. The dielectric layer 146 is formed using the deposition process described above, but making sure that the exposed sides of both via connections 132 and 178 and both metal conductor lines 116 and 176 are covered. The metal region 148 is formed in a damascene process as described above to fill the space formed by the dielectric layer 146. The ILD layer 110 is formed using the same process described above. Additionally, the via connection 184 and the metal conductor line 186 are formed simultaneously with the via connections 136 and 150 and the metal conductor lines 120 and 122 using the same dual damascene process steps described above.

A stacked capacitor 204, shown in FIG. 14, is formed with similar process steps as those described above to form the capacitor 140 (FIG. 1) and has a similar structure thereto, but with differences that provide a higher capacitance. The stacked capacitor 204 includes the capacitor 174 (as described above with reference to FIG. 10) and an upper capacitor 206 connected together to form the single stacked capacitor 204. Thus, the stacked capacitor 204 has higher capacitance than the capacitor 140.

The lower capacitor 174 is described above, and the upper capacitor 206 is similar to the capacitor 140 shown in FIG. 1. In particular, the outer capacitor plate 180 of the lower capacitor 174 is formed by the metal conductor lines 116 and 176 and the via connections 132 and 178, which are connected together through metal interconnect layer 102. The inner capacitor plate 182 is formed by the metal region 148. The outer and inner capacitor plates 180 and 182, respectively, are separated by the dielectric layer 146. Also, a right capacitor plate 208 of the upper capacitor 206 is formed by a metal conductor line 208 and a via connection 210, and a left capacitor plate 212 is formed by a metal region 214. The right and left capacitor plates 208 and 210, respectively, are separated by a dielectric layer 216.

The upper capacitor 206 of the stacked capacitor 204 is disposed in an additional ILD layer 218 and an additional metal interconnect layer 220 above the ILD layer 110 and metal interconnect layer 106. Another ILD layer 222 and another metal interconnect layer 224 overlay the metal interconnect layer 220.

To connect the inner capacitor plate 182 with the left capacitor plate 212, the top side of the metal region 148 connects to the top side of the metal region 214 through the via connection 150 in ILD layer 110, a metal conductor line 226 in the metal interconnect layer 106, stacked via 228 in the ILD layers 218 and 222 and the metal interconnect layer 220, a metal conductor line 230 in the metal interconnect layer 224 and a via connection 232 in the ILD layer 222. To connect the outer capacitor plate 180 with the right capacitor plate 206, the metal conductor line 116 is connected to the via connection 210 through the via connection 136 in ILD layer 110 and a metal conductor line 234 in the metal interconnect layer 106. Alternatively, the bottom side of the metal region 214 can be connected to the metal interconnect layer 106 through a via connection (not shown). Additionally, the metal conductor line 208 connects to a metal conductor line 236 in metal interconnect layer 224 through a via connection 238 in ILD layer 222. With this connection scheme, the outer capacitor plate 180 and the right capacitor plate 206 of the stacked capacitor 204 can be electrically connected to the rest of the IC structure 100 (FIG. 1) through any metal interconnect layer 102, 104,106, 220 or 224. Likewise, the inner capacitor plate 182 and left capacitor plate 212 of stacked capacitor 204 can be electrically connected to the rest of the IC structure 100 through any metal interconnect layer 104, 106, 220 or 224.

The via connection 178 and the metal conductor line 176 are formed simultaneously with the via connection 132 and the metal conductor line 116 using the same dual damascene process steps described above. Likewise, the via connection 210 and the metal conductor line 208 are formed using similar dual damascene process steps.

The dielectric layer 146 is formed using the deposition process described above, but making sure that the exposed sides of both via connections 132 and 178 and both metal conductor lines 116 and 176 are covered. The dielectric layer 216 is formed using a similar deposition process, making sure that the exposed sides of the via connection 210 and the metal conductor line 208 are covered.

The metal region 148 is formed in a damascene process as described above to fill the space formed by the dielectric layer 146. Likewise, the metal region 214 is formed in a similar damascene process to fill the space formed by the dielectric layer 216.

An interdigitated capacitor 240, as shown in FIG. 15, incorporates any of the capacitors 140,174, 188,196, 202 or 204 shown in FIGS. 1 and 10–14. The interdigitated capacitor 240 has two interdigitated comb-like capacitor plates 242 and 244. The capacitor plates 242 and 244 include several interdigitated fingers 246 and 248, respectively. The fingers 246 and 248 are connected together through connector lines 250 and 252, respectively, to connection areas 254 and 256, respectively. The connection areas 254 and 256 connect the capacitor 240 to the rest of the IC structure 100. Each finger 246 and 248 is formed by one of the capacitor plates 142, 144 (FIG. 1), 180, 182 (FIGS. 10, 13 and 14), 190, 192, 194 (FIG. 11), 198, 200 (FIG. 12), 206 and 212 (FIG. 14) described above. Two of the fingers 246 and 248 (or three in those cases where the outer capacitor plate is formed on both sides of the inner capacitor plate) form any one of the capacitors 140, 174, 188, 196, 202 or 204 described above. Therefore, due to the presence of several of the fingers 246 and 248, the interdigitated capacitor 240 includes multiple side-by-side capacitors 140, 174, 188, 196, 202 or 204 with their corresponding capacitor plates connected together through the connector lines 250 and 252.

The VMIM capacitor 140 (FIG. 1), 174 (FIG. 10), 188 (FIG. 11), 196 (FIG. 12), 202 (FIG. 13) or 204 (FIG. 14) has the advantage of a vertical capacitor structure, with no complexity that requires stringent process controls. In addition, the processes to form the VMIM capacitor 140 or 174 have the advantage of utilizing the damascene processes for forming the metal interconnect layers within which the VMIM capacitor 140 or 174 is located. Additionally, for each of the embodiments, both of the capacitor plates of the capacitor can typically be contacted through the same metal interconnect layer, which often simplifies the routing of IC circuits.

Presently preferred embodiments of the invention and its improvements have been described with a degree of particularity. This description has been made by way of preferred example. It should be understood that the scope of the present invention is defined by the following claims, and should not be unnecessarily limited by the detailed description of the preferred embodiments set forth above.

The invention claimed is:

1. A method of forming a vertical metal-insulator-metal (VMIM) capacitor at least partially in an interlayer dielectric (ILD) layer between horizontal first and second metal interconnect layers in an integrated circuit (IC), the first metal interconnect layer being separated from a substrate of the IC by at least one dielectric layer, the method comprising the steps of:

forming the second metal interconnect layer in a top side of the ILD layer;

forming a first vertical capacitor plate of the VMIM capacitor at least partially in the second metal interconnect layer;

forming a capacitor dielectric material onto a vertical sidewall of the first vertical capacitor plate;

forming a second vertical capacitor plate adjacent to the capacitor dielectric material;

forming the second metal interconnect layer and the first and second vertical capacitor plates by damascene metallization steps; and forming the second metal interconnect layer and the first vertical capacitor plate substantially concurrently.

2. A method as defined in claim 1 further comprising the step of:

forming the first vertical capacitor plate of the VMIM capacitor to extend from the second metal interconnect layer into the ILD layer between the first and second metal interconnect layers.

3. A method as defined in claim 2 further comprising the steps of:

exposing a vertical sidewall of the first vertical capacitor plate by forming a trench in the ILD layer adjacent to the vertical sidewall;

forming a metal liner on an inner bottom surface and inner sidewall surfaces of the trench including on the vertical sidewall of the first vertical capacitor plate, the metal liner forming an extension of the first vertical capacitor plate at least partially surrounding the second vertical capacitor plate, the extension of the first vertical capacitor plate forming an outer capacitor plate of the VMIM capacitor;

forming the capacitor dielectric material on an inner bottom surface and inner sidewall surfaces of the metal liner; and forming the second vertical capacitor plate in an inner region defined by the capacitor dielectric material, the second vertical capacitor plate forming an inner capacitor plate of the VMIM capacitor.

4. A method as defined in claim 2, wherein the first vertical capacitor plate is disposed on a first side of the second vertical capacitor plate, the method further comprising the steps of:

forming, by the damascene metallization steps and substantially concurrently with the first vertical capacitor plate, a third vertical capacitor plate on a second side of the second vertical capacitor plate opposite the first side; and electrically connecting the first and third vertical capacitor plates to form an outer capacitor plate of the VMIM capacitor, the second vertical capacitor plate defining an inner capacitor plate.

5. A method as defined in claim 4 further comprising the step of:

forming, by the damascene metallization steps, first and second metal conductor lines within the second metal interconnect layer and first and second via connections through the ILD layer, a portion of the first metal conductor line and a portion of the first via connection defining a portion of the first vertical capacitor plate of the VMIM capacitor, and a portion of the second metal conductor line and a portion of the second via connection defining a portion of the third vertical capacitor plate.

6. A method as defined in claim 2 further comprising the steps of:

forming a bottom capacitor plate below the second vertical capacitor plate;

forming a portion of the capacitor dielectric material onto a top side of the bottom capacitor plate; and forming, by the damascene metallization steps, a portion of the second vertical capacitor plate above the portion of the capacitor dielectric material that is formed onto the top side of the bottom capacitor plate.

7. A method as defined in claim 6 further comprising the step of:

forming the bottom capacitor plate within the first metal interconnect layer.

8. A method as defined in claim 2 further comprising the step of:

removing a portion of the first metal interconnect layer below an area occupied by the second vertical capacitor plate.

9. A method as defined in claim 2, further comprising the step of:

forming, by the damascene metallization steps, a metal conductor line within the second metal interconnect layer and a via connection through the ILD layer, a portion of the metal conductor line and a portion of the via connection defining a portion of the first vertical capacitor plate of the VMIM capacitor.

10. A method as defined in claim 9, wherein the step of forming the metal conductor line and the via connection further comprises the step of:

forming the metal conductor line and the via connection by dual damascene metallization steps.

11. A method as defined in claim 10, wherein the step of forming the metal conductor line and the via connection further comprises the steps of:

removing a first portion of the ILD layer to form a trench in the top of the ILD layer for the metal conductor line;

removing a second portion of the ILD layer, contiguous with the first portion of the ILD layer, to form a hole for the via connection through the ILD layer;

depositing, in a single metal deposition step, a metal material above the ILD layer and into the hole and the trench to form the via connection and the metal conductor line; and removing the metal material above the ILD layer.

12. A method as defined in claim 9 further comprising the step of:

electrically connecting the metal conductor line and the first metal interconnect layer with the via connection through the ILD layer.

13. A method as defined in claim 2, further comprising the steps of:

forming a second ILD layer, in addition to the ILD layer first aforesaid, above the second metal interconnect layer;

forming, by the damascene metallization steps, a third metal interconnect layer in a top side of the second ILD layer;

forming, by the damascene metallization steps and substantially concurrently with the third metal interconnect layer, a third vertical capacitor plate of the VMIM capacitor above the first vertical capacitor plate, a first portion of the third vertical capacitor plate being disposed in the third metal interconnect layer and a second portion of the third vertical capacitor plate being disposed in the second ILD layer;

forming a second capacitor dielectric material, in addition to the capacitor dielectric material first aforesaid, onto a vertical sidewall of the third vertical capacitor plate;

forming, by the damascene metallization steps, a fourth vertical capacitor plate adjacent to the second capacitor dielectric material;

electrically connecting the first and third vertical capacitor plates to form a first stacked capacitor plate of the VMIM capacitor; and electrically connecting the second and fourth vertical capacitor plates to form a second stacked capacitor plate of the VMIM capacitor.

14. A method as defined in claim 13, further comprising the steps of:

forming a third ILD layer between the second metal interconnect layer and the second ILD layer;

forming a fourth metal interconnect layer in a top side of the third ILD layer;

forming a metal conductor line in the fourth metal interconnect layer; and electrically connecting the second and fourth vertical capacitor plates through the metal conductor line in the fourth metal interconnect layer.

15. A method as defined in claim 14, further comprising the steps of:

forming a fourth ILD layer above the third metal interconnect layer in a top side of the second ILD layer;

forming a fifth metal interconnect layer in a top side of the fourth ILD layer;

forming an electrical connection between the fourth metal interconnect layer and the fifth metal interconnect layer;

forming an electrical connection between the fifth metal interconnect layer and the fourth vertical capacitor plate; and electrically connecting the second and fourth vertical capacitor plates through the metal conductor line in the fourth metal interconnect layer, through the electrical connection between the fourth and fifth metal interconnect layers, through the fifth metal interconnect layer and through the electrical connection between the fifth metal interconnect layer and the fourth vertical capacitor plate.

16. A method as defined in claim 2, further comprising the steps of:

forming, by the damascene metallization steps and substantially concurrently with the first vertical capacitor plate, a third vertical capacitor plate of the VMIM capacitor laterally spaced from the first vertical capacitor plate, the third vertical capacitor plate being disposed at least partially in the second metal interconnect layer;

forming a second capacitor dielectric material, in addition to the capacitor dielectric material first aforesaid, onto a vertical sidewall of the third vertical capacitor plate;

forming, by the damascene metallization steps, a fourth vertical capacitor plate adjacent to the second capacitor dielectric material;

electrically connecting the first and third vertical capacitor plates to form a first side-by-side capacitor plate of the VMIM capacitor; and electrically connecting the second and fourth vertical capacitor plates to form a second side-by-side capacitor plate of the VMIM capacitor.

17. A method of forming a vertical metal-insulator-metal (VMIM) capacitor at least partially in an interlayer dielectric (ILD) layer between horizontal first and second metal interconnect layers in an integrated circuit (IC), the first metal interconnect layer being separated from a substrate of the IC by at least one dielectric layer, the second metal interconnect layer being formed by damascene-metallization steps, the VMIM capacitor having first and second substantially vertical plates separated by a capacitor dielectric material, the method comprising the steps of:

forming the first vertical capacitor plate by damascene-metallization steps; forming the second metal interconnect layer and the first vertical capacitor plate substantially concurrently and forming the second vertical capacitor plate by damascene-metallization steps.

* * * * *